United States Patent [19]

Raffay et al.

[11] Patent Number: 4,743,156
[45] Date of Patent: May 10, 1988

[54] DUMP TRANSFER WAFER CARRIER

[75] Inventors: Grace K. Raffay, Tempe; Debra A. Mattingly, Mesa; Marlo E. Smith, Tempe; Dufrasne, Brenda R., Chandler; Louise Wood, Gilbert; Jill M. Hickman, Scottsdale; Steven L. Dunavant, Gilbert; Pamela D. Quillen; Frances A. Mott, both of Chandler; Barbara J. Byas, Mesa; Hope Riggers, Phoenix; Alice D. Booth, Mesa, all of Ariz.

[73] Assignee: Motorola, Inc., Schaumburg, Ill.

[21] Appl. No.: 861,473

[22] Filed: May 9, 1986

[51] Int. Cl.$^4$ ............................................. B65B 21/02
[52] U.S. Cl. ..................................... 414/405; 211/40; 220/4 E
[58] Field of Search ............... 206/507, 508, 509, 454, 206/503; 414/405; 220/4 E; 211/40, 41; 312/284

[56] References Cited

U.S. PATENT DOCUMENTS

| | | | |
|---|---|---|---|
| 2,487,168 | 11/1949 | Mordkin | 220/4 E |
| 3,360,152 | 12/1967 | Leers | 220/4 E |
| 3,508,643 | 4/1970 | Horn | 220/4 E |
| 3,645,025 | 2/1972 | Giesecke | 220/4 E |
| 3,934,733 | 1/1976 | Worden | 206/454 X |
| 4,049,357 | 9/1977 | Hamisch, Jr. | 220/4 E |
| 4,219,693 | 8/1980 | French | 220/4 E |
| 4,493,418 | 1/1985 | Johnson | 211/40 |

Primary Examiner—James T. McCall
Attorney, Agent, or Firm—Robert M. Handy

[57] ABSTRACT

An improved wafer carrier adapted for use in storing and transferring semiconductor wafers is described. The carrier generally resembles prior art carriers in that it is an open topped basket with internal slots for receiving spaced apart semiconductor wafers. Rails having smooth upper surfaces are provided along two opposed edges of the open top. One rail has an elongated bar or ridge protruding from its upper surface and the other rail has a mating elongated groove recessed into its upper surface. To make a dump transfer, an empty carrier is inverted and placed face-to-face against a loaded carrier with the upper surfaces of the two carriers in contact. The ridge and groove of the empty carrier engage the groove and ridge of the full carrier thereby aligning the wafer slots of the two carriers. The two carrier unit is then inverted and the wafers smoothly dump from the full to the empty carrier. The elongated bar and groove arrangement for aligning the two carriers is more rugged and reliable than the small pin and hole arrangement of the prior art. The improved carrier is much less likely to be damaged in use and the dump transfer yield is better.

10 Claims, 4 Drawing Sheets

DUMP TRANSFER WAFER CARRIER

FIELD OF THE INVENTION

This invention relates in general to carriers or baskets for holding and transferring flat objects and, more particularly to an improved basket for holding and transferring semiconductor wafers.

BACKGROUND ART

Wafer carriers or baskets are much used in the manufacture of electronic devices. For example, during the manufacture of integrated circuits, semiconductor wafers are subjected to a variety of processing steps in which they are held in and transferred between plastic baskets or carriers. The baskets have slots to support the wafers by their edges in a spaced-apart arrangement so that scratching of the wafer surfaces is minimized. Such wafer carriers or baskets are well known in the art. Examples of such prior art carriers are the semiconductor wafer baskets manufactured by Fluoroware, Inc., Chaska, Minn. Prior art semiconductor wafer baskets are also described in U.S. Pat. Nos. 3,923,156, 3,961,877, and 4,471,716 which are incorporated herein by reference. As used herein, the words "carrier" and "basket" in connection with a device for holding wafers are intended to be synonymous.

During processing it is frequently necessary to transfer the wafers from one carrier or basket to another. This is most conveniently accomplished by placing an empty basket on top of the filled basket with the open faces together. Small round alignment pins and matching holes in the upper edges of the baskets align the wafer slots of the two baskets. The combination of the two baskets are then inverted so that the wafers roll and/or slide from one basket to the other. This procedure is referred to in the art as a "dump transfer" or "roll transfer". For the purpose of this invention it is not important whether transfer of the wafers from one basket to the other is by rolling or sliding, and the words "dump transfer" are intended to include all manner of rolling or sliding motions which may take place during the process of transferring the wafers from one basket to another. As a practical matter, it is desirable that the transfer process not introduce any scratches or other mechanical defects or contamination in the wafers.

While the prior art baskets have been extensively used, the small round alignment pins and holes provided for aligning the wafer slots during dump transfers have not proved particularly reliable. The pins are easily damaged or broken during use. Further, the operator using the basket or performing a dump transfer may not detect the presence of damaged or missing alignment pins, with the result that the baskets do not remain in alignment during the transfer operation and the wafers contained therein may be damaged or broken. Thus, the relatively poor reliability of the prior art carriers can result in significant manufacturing loss of the wafers being handled therein, particularly during transfer operations. Accordingly, a need continues to exist for an improved carrier and method for holding and transferring wafers, particularly semiconductor wafers.

It is an object of the present invention to provide an improved carrier for holding and transferring wafers, particularly semiconductor wafers.

It is a further object to provide an improved carrier having a dump transfer alignment means which is more robust and reliable than in the prior art.

It is an additional object of the present invention to provide an improved wafer carrier having a means for improved alignment of the wafer slots in the carriers being mated for dump transfer of wafers.

It is an additional object of the present invention to provide an improved process for dump transferring wafers, particularly semiconductor wafers.

SUMMARY OF THE INVENTION

The attainment of the foregoing and other objects and advantages is achieved through the present invention wherein there is provided a carrier for dump transferring wafers comprising: a box with an open top for inserting and removing wafers, a partially open bottom, opposed upright endwalls, and sidewalls with inner slots formed between multiple ribs for receiving spaced-apart wafers in the slots; wherein the box has at opposed sides of the open top, first and second substantially flat top rails having, respectively, first and second upper surfaces lying in parallel planes and extending between the sides or upright ends; wherein the top rails have elongated ridge means protruding upwardly from the first upper surface and elongated groove means recessed downwardly into the second upper surface; and wherein the elongated ridge means and elongated groove means are symmetrically located on the first and second upper surfaces so that, when two carriers are placed upper surface to upper surface, the ridge and groove means of the first carrier engage the groove and ridge means of the second carrier, and the wafer receiving slots of the two carriers are aligned. It is desirable that the elongated ridge and groove means be disposed along the sides of the box adjacent the multiple ribs and extend for substantially the same length of the side as the multiple ribs, and that the first and second upper surfaces be in the same plane.

A method is further provided wherein two substantially identical carriers, formed as described above, are utilized, a first carrier being loaded with wafers in its multiple slots and a second (empty) carrier being placed against the first carrier with its open side facing the open side of the first carrier. The symmetrical ridge and groove means on the two carriers are engaged to align the wafer slots and form a two carrier unit. The two carrier unit is inverted to cause the wafers in the first carrier to dump into the second carrier, and then the first carrier is removed.

These and other features and advantages of the invention will be more fully understood in view of the drawings and detailed description thereof which follow.

DETAILED DESCRIPTION OF THE DRAWINGS

Figure 1:
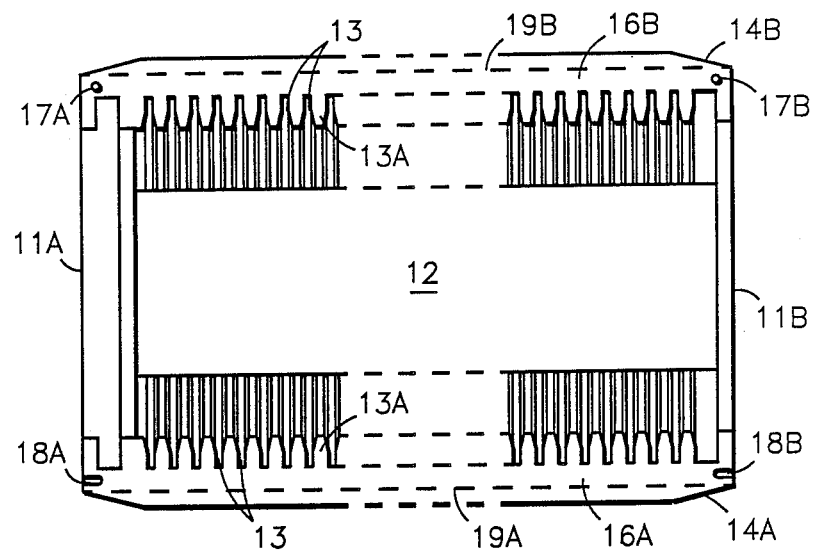
FIG. 1 shows a top view of a typical semiconductor wafer carrier according to the prior art.
Figure 2:
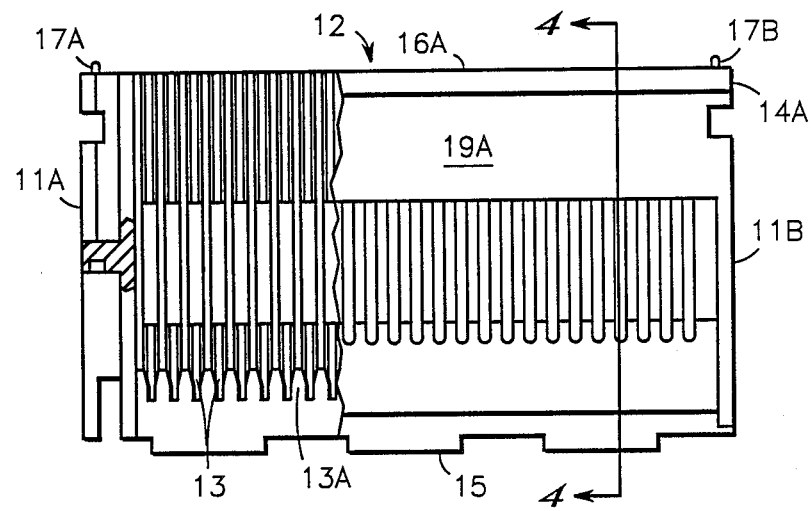
FIG. 2 shows a side view of the wafer carrier of FIG. 1.
Figure 3:
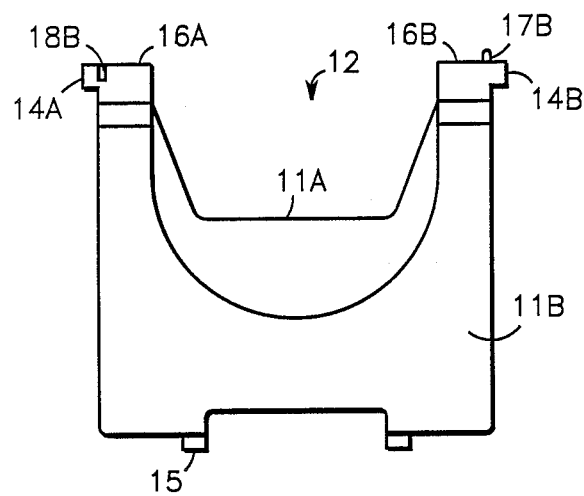
FIG. 3 shows an end view of the wafer carrier of FIG. 1.
Figure 4:
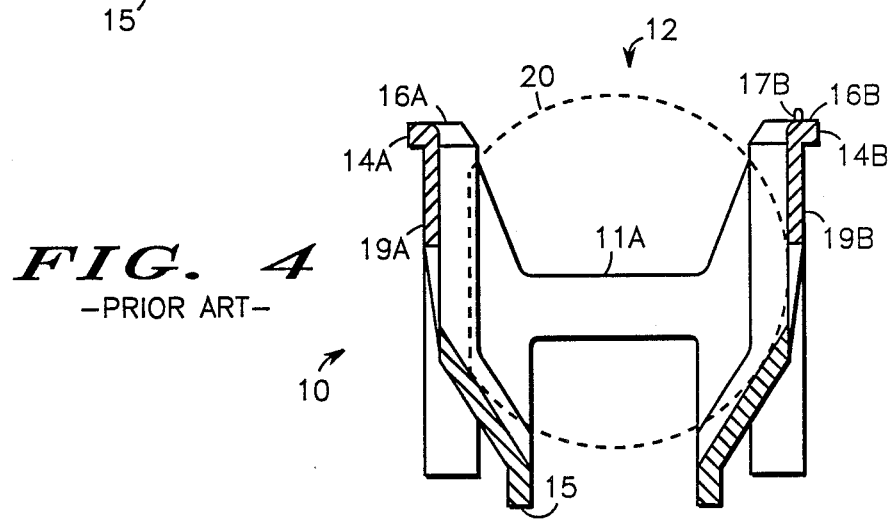
FIG. 4 shows a cross-sectional view of the wafer carrier of FIG. 1.
Figure 8:
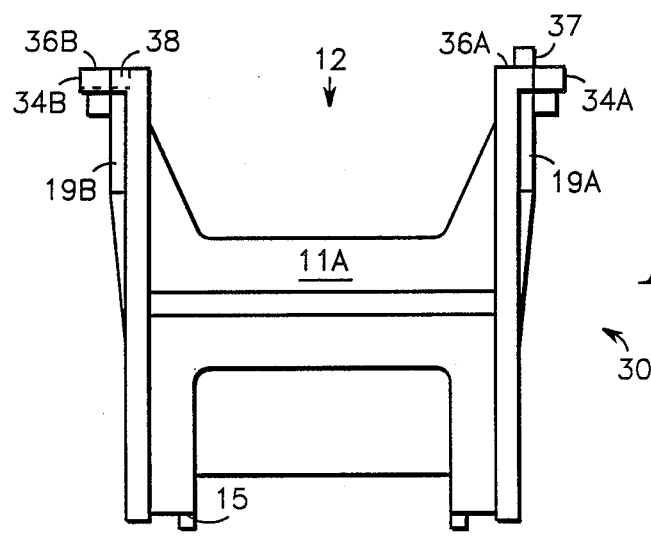
FIG. 8 shows an end view of the wafer carrier of FIG. 5.

FIGS. 1-4 show a top view, partially cut-away side view, end view, and cross-sectional view, respectively, of a typical wafer carrier according to the prior art. Wafer carrier 10 has upright ends 11a-b, sides 19a-b, open top 12, and partially closed bottom 15. The inner surfaces of sides 19a-b contain slots 13 between multiple ridges 13a. Slots 13 are intended to receive wafers 20, as indicated in FIG. 4. Wafers 20 are inserted into carrier 10 through open top 12. Longitudinal rails 14a-b are located along two parallel opposed edges of open top 12 at the top of sides 19a-b. Longitudinal rails 14a-b have upper surfaces 16a-b. Upper surfaces 16a-b of rails 14a-b are flat, smooth and lie in a commonplane. Alignment pins 17a-b protrude from surface 16b of rail 14b. Mating holes 18a-b are provided in surface 16a of rail 14a. Pins 17a-b and holes 18a-b are arranged so that when two identical carriers are placed face to face with upper surface 16a of the first carrier in contact with upper surface 16b of the second carrier, then pins 17a-b engage holes 18a-b. When the upper surfaces of the two carriers are engaged in this way, then slots 13 of the two carriers are aligned. With this arrangement, wafer placed in slots 13 of the first carrier can be transferred to the corresponding slots of the second carrier merely by inverting the two, joined carriers. The wafers roll or slide by gravity from the first carrier to the second. This is referred to as a dump transfer.

A significant weakness of these prior art carriers is that pins 17a-b are easily damaged and/or broken off. Since they are relatively small compared to the basket itself, damaged or missing pins may not be noticed by the operator who is loading a dump transfer apparatus or performing a dump transfer. When this happens one carrier may be inadvertently misaligned with respect to the other, so that when the wafer dump is performed, the wafers do not transfer smoothly from the slots in the first carrier to the slots in the second carrier. As a result, the wafers are often scratched or broken. This causes a manufacturing yield loss which is expensive and undesirable.

Figure 5:
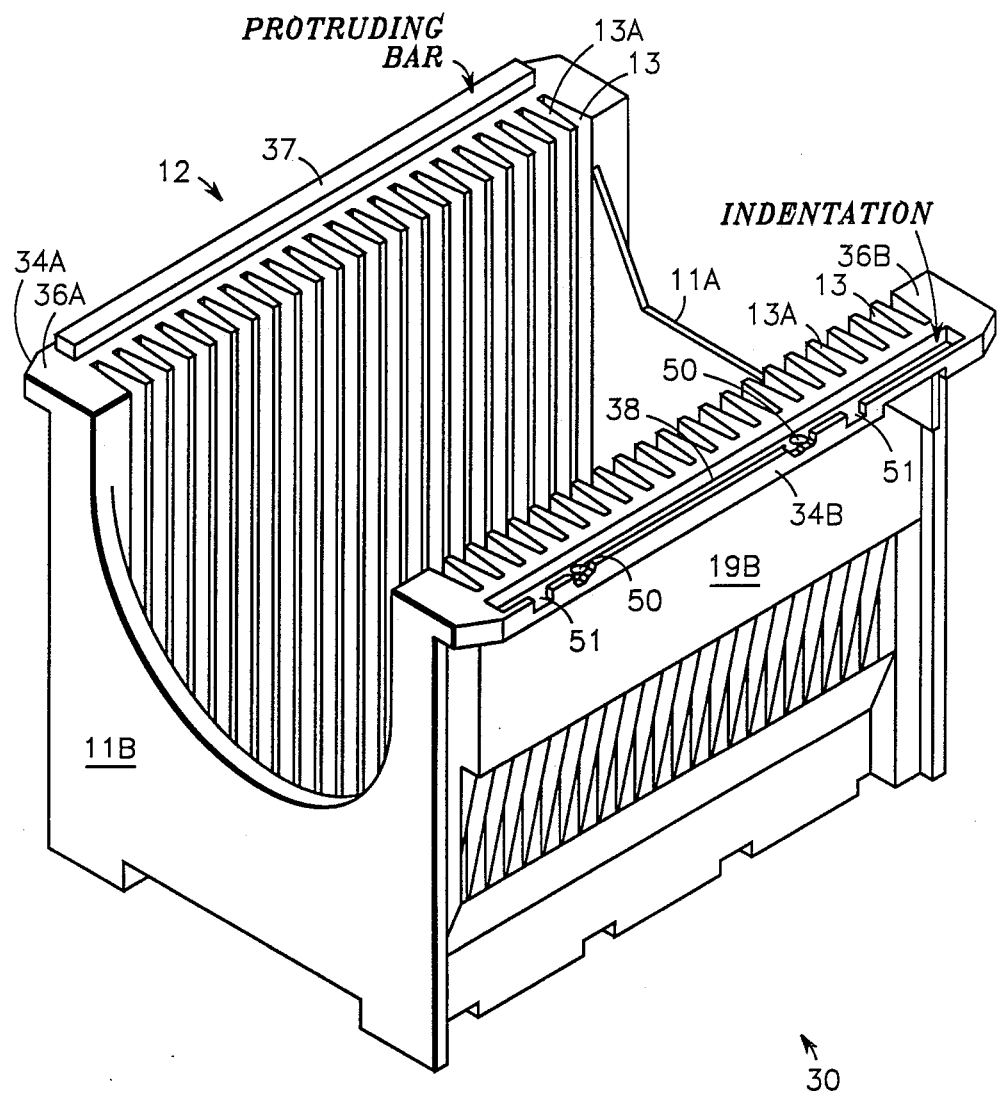
FIG. 5 shows an isometric view of a wafer carrier according to the present invention.

These and other deficiencies of the prior art carriers are overcome by the carrier of the present invention illustrated in simplified form in FIGS. 5-8. FIG. 5 shows an isometric view, FIG. 6 a top view, FIG. 7 a side view, and FIG. 8 an end view of a preferred embodiment of carrier 30 of the present invention. Carrier 30 of FIGS. 5-8 is generally similar to prior art carrier 10 of FIGS. 1-4 and the same identification numbers have been used where appropriate.

Carrier 30 has open top 12, upright sides 19a-b and ends 11a-b, and bottom 15. Internal to sides 19a-b are slots 13 between multiple ridges 13a for receiving wafers in the same way as in prior art carrier 10 of FIGS. 1-4. Side rails 34a-b having upper surfaces 36a-b are provided along two edges of sides 19a-b and open top 12 of carrier 30, and function in much the same manner as rails 14a-b and surfaces 16a-b in carrier 10. Surface 36a is provided with elongated protruding bar 37 and surface 36b is provided with mating elongated groove or indentaiton 38 recessed below surface 36b or vice-versa. Elongated bar 37 and elongated groove 38 are symmetrically arranged so that when two substantially identical carriers are placed face to face with surface 36a of the first carrier opposite surface 36b of the second carrier, then elongated ridge 37 and groove 38 of the first carrier engage elongated groove 38 and ridge 37 of the second carrier and slots 13 of the two carriers are aligned to permit a smooth dump transfer. Having elongated bar or ridge 37 extend substantially along the length of rail 34a, and having elongated groove 38 extend substantially along the length of rail 34b provides a much more rugged arrangement for aligning the faces and slots of carrier 30 for a dump transfer than the small circular pins and holes of prior art carrier 10.

It is desirable that width 41 of elongated bar or ridge 37 be large enough to resist shearing from rail 34a. Having width 41 be at least forty percent of distance 44 between slots 13 and the outer edge of rail 34a is desirable. Width 41 is conveniently in the range 0.1 to 0.3 inches with about 0.2 being preferred. Height 42 and width 41 of bar or ridge 37 are conveniently about equal. Width 45 of groove 38 is slightly larger than width 41 of ridge or bar 37 so that the bar and groove may easily slip together and apart. Clearance dimensions of about 0.005-0.010 inches are convenient. Since the wafers which are typically being handled in such carriers are generally of three to six inches in diameter or larger and slots 13 are generally tapered, some side-to-side misalignment can be tolerated and such clearance amounts are acceptable.

Length 47 of groove 38 is also slightly larger than length 43 of ridge or bar 37. The length clearance dimension should usually be the same or smaller than the width clearance dimension. Typical wafer thickness are of the order of a few tens of thousandths of an inch. Typical center to center spacing of slots 13 is about 0.2 inches. The taper on slots 13 also permits some lengthwise misalignment. Convenient lengthwise clearance amounts between bar 37 and groove 38 are about 0.005-0.010 inches or less. Height 42 of bar 37 is desirably less than the depth of groove 38. The depth of groove 38 should be less than the thickness of rail 34b.

In order to have bar 37 be rugged and provide good angular alignment in cooperation with groove 38, it is desirable that bar 37 and groove 38 extend along the length of rails 34a-b substantially for the same distance occupied by multiple slots 13. However, bar 37 and groove 38 need not be continuous but may consist of multiple elongated segments. For good alignment purposes, it is desirable that bar 37 has at least two elongated segments, one located substantially at each end of the rail. Groove 38 may also be continuous or segmented, as appropriate to mate with bar 37.

Figure 6:
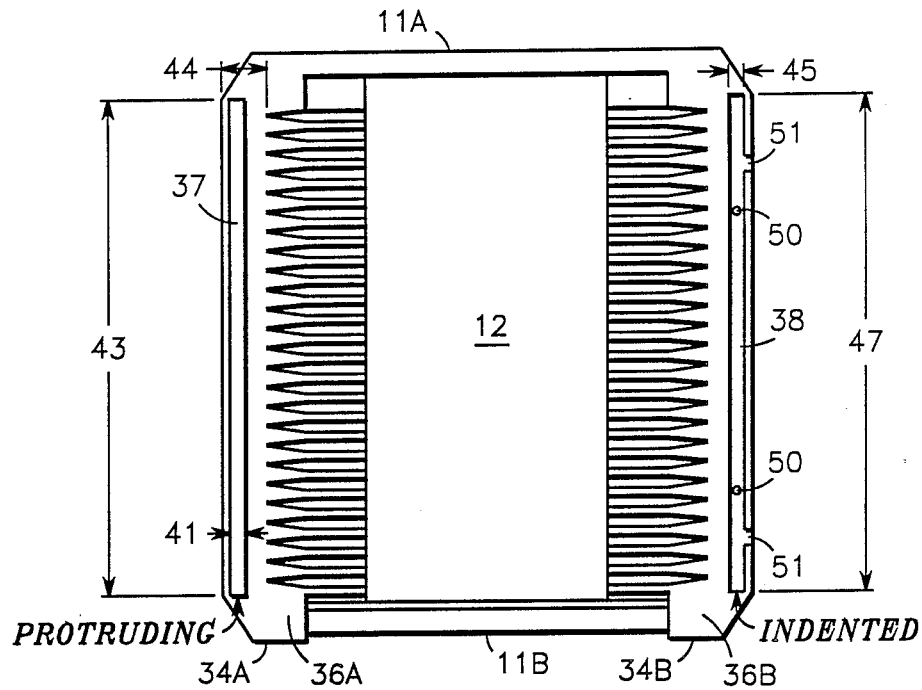
FIG. 6 shows a top view of the wafer carrier of FIG. 5.
Figure 7:
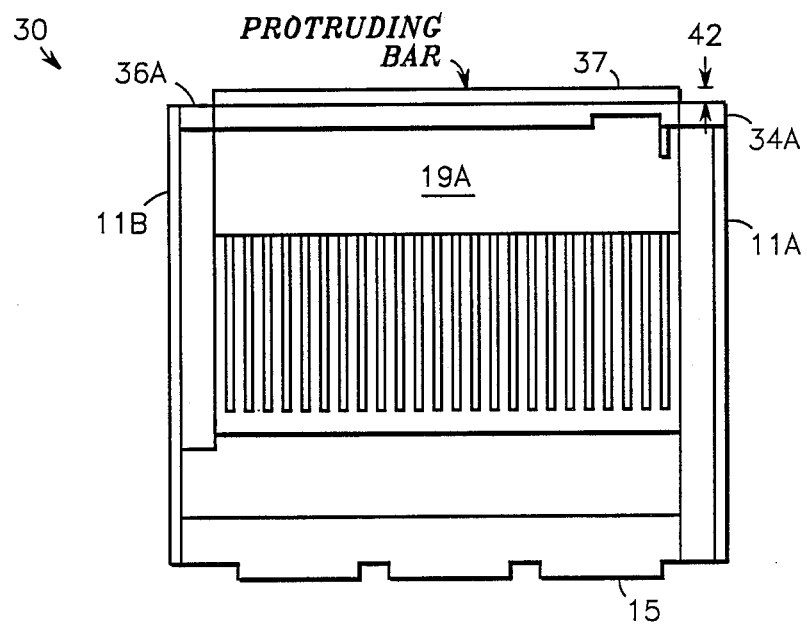
FIG. 7 shows a side view of the wafer carrier of FIG. 5.

It will be appreciated by those of skill in the art that the arrangement of elongated bar 37 and groove 38 shown in FIGS. 5-8 is substantially more rugged and reliable than the arrangement of small pins 17a-b and holes 18a-b of the prior art. It has been found that wafer damage and breakage is substantially reduced with the wafer carrier of the present invention. It will also be appreciated by those of skill in the art that the teachings of the present invention may be applied with carriers of different geometry. For example, bar 37 and groove 38 may be provided along any two opposed edges of open side 12, i.e., along either of sides 19a-b or either of ends 11a-b. Further, rails 34a-b and surfaces 36a-b need not lie in the same plane. For example, surface 36a may be elevated a predetermined distance above a plane representing the top of carrier 30 and surface 36b may be depressed an equal distance below this plane. It is convenient for surfaces 36a and 36b to be in parallel planes, preferably in the same plane. An noted previously, bar 37 (and groove 38) need not be continuous and may be formed of two or more elongated segments with at least two of the elongated segments positioned substantially at the ends of the rail or slightly inwardly from the ends of the rail adjacent the first and last wafer slot. It is also desirable that groove 38 be provided with drainage means so that no liquid or other foreign material is trapped in groove 38. Examples of suitable drainage means are drain holes 50 extending through rail 34b or subsidiary grooves 51 extending from groove 38 to the edge of rail 34b, or combinations of holes and subsidiary grooves. Holes 50 and grooves 51 are shown in FIG. 6. Accordingly, it is intended to include these and other variations within the claims which follow.

We claim:

1. A wafer basket for holding an dump-transferring wafers, comprising:
    a substantially rectangular box wherein one of the sides of said box is open for eceiving wafers whose major faces are oriented in a direction substantially perpendicular to said open side;
    slot means inside said box and accessible from said open side for receiving and moveably retaining said wafers when said box is in an upright position and releasing said wafers when said box is in an inverted position;
    rim means located at the periphery of said open side having elongated first and second flat faces oriented along first and second edges of said open side, wherein said flat faces are substantially parallel to said open side;
    elongated ridge means protruding from said first flat face and aligned along said elongated first flat face;
    elongated groove means recessed into said second flat face and aligned along said elongated second flat face;
    drain means extending from a bottom of said groove means through said rim means for allowing liquid collected in said groove means to escape; and
    wherein said eleongated ridge and groove means are located so that when first and second faces of a first wafer basket are placed in contact with second and first faces of a second, substantially identical wafer basket, then the ridge and groove means of said first wafer basket engage the groove and ridge means of said second wafer baskket and the slot means of said first and second wafer baskets are aligned.

2. The wafer basket of claim 1 wherein said elongated ridge means has a first height above said first face, and a width perpendicular to said height, and a length perpendicular to said width and along said first flat face, and wherein said height and width are substantially equal.

3. The wafer basket of claim 2 wherein said slot means are located along the same sides of the box as said ridge and groove means and wherein said slot means comprises serially arranged first, intermediate, and last parallel slots, each for receiving a wafer, and wherein a first end of said elongated ridge and groove means is located adjacent said first slot and a second end of said elongated ridge and groove means is located adjacent said last slot.

4. The basket of claim 1 wherein said first and second faces lie in substantially the same plane.

5. A carrier useful for dump-transfer of electronic wafers, comprising:
    a box having an open upward facing top for insertion and removal of said wafers, a partially open bottom, opposed upright endwalls, and sidewalls with inner slots formed between multiple ribs for receiving spaced-apart wafers in said slots;
    wherein said box has at opposed edges of said open top, first and second top rails having, respectively, first and second upper surfaces lying in parallel planes and extending between either said sidewalls or said upright ends;
    wherein said top rails have elongated ridge means protruding upwardly from said first upper surface and elongated groove means recessed downwardly into said second upper surface;
    drain means passing at least laterally through said top rail from said groove means for draining away liquid from said groove means; and
    wherein said elongated ridge means and elongated groove means are symmetrically located on said first and second upper surfaces so that, when two of said carriers are placed upper surface to upper surface, the ridge and groove means of the first carrier engage the groove and ridge means of the second carrier, and the wafer receiving slots of the two carriers are aligned.

6. The carrier of claim 5 wherein said elongated ridge and groove means are aligned in a direction parallel to said top rails.

7. The carrier of claim 5 wherein said elongated ridge and groove means are aligned in parallel directions extending substantially between either said sidewalls or said upright ends.

8. The carrier of claim 5 wherein said first and second upper surfaces lie substantially in the same plane.

9. A method for transferring wafers between substantially indentical wafer carriers, comprising:
    providing a first carrier having an open upward facing top for inserting and removing said wafers, a partially open bottom, opposed upright endwalls, and opposed sidewalls with inner slots between multiple ribs for receiving wafers in the slots, wherein said first carrier has at opposed edges of said open top, first and second top rails having, respectively, first and second upper surfaces lying in parallel planes and both extending between either said opposed sidewalls or said upright ends, wherein said groove means comprises drain means extending from said groove means for draining liquid from said groove means, wherein said top rails have elongated ridge means protruding upwardly from said first upper surface and elongated groove means recessed downwardly into said second upper surface, and wherein said elongated ridge means and elongated groove means are symmetrically located on said first and second surfaces so that, when two of said carriers are placed upper surface to upper surface, the ridge and groove means of the first carrier engage the groove and ridge means, respectively, of the second carrier, and the wafer receiving slots of the two carriers are aligned;
    orienting said first carrier so that its open top does not face down;
    inserting wafers into said slots in said first carrier;
    providing a second carrier substantially identical to said first carrier;

locating said second carrier facing said first carrier so that the open top of said second carrier faces the open top of said first carrier;

placing the first and second carriers together as a unit with the elongated ridge and groove means of said first carrier in engagement with the elongated groove and ridge means, respectively, of said second carrier;

rotating the combination of said first and second carrier so that the wafers in the slots of said first carrier roll or slide into the slots of said second carrier; and thereafter removing said first carrier.

10. The method of claim 9 wherein said step of providing a first carrier comprises providing a first carrier having first and second upper surfaces lying substantially in the same plane.

* * * * *